US00RE38523E

(19) United States
(12) Reissued Patent
Ozluturk

(10) Patent Number: US RE38,523 E
(45) Date of Reissued Patent: Jun. 1, 2004

(54) SPREADING CODE SEQUENCE ACQUISITION SYSTEM AND METHOD THAT ALLOWS FAST ACQUISITION IN CODE DIVISION MULTIPLE ACCESS (CDMA) SYSTEMS

(75) Inventor: Fatih Ozluturk, Port Washington, NY (US)

(73) Assignee: InterDigital Technology Corporation, Wilmington, DE (US)

(21) Appl. No.: 09/559,771

(22) Filed: Apr. 27, 2000

Related U.S. Patent Documents

Reissue of:
(64) Patent No.: 5,748,687
Issued: May 5, 1998
Appl. No.: 08/669,776
Filed: Jun. 27, 1996

U.S. Applications:
(60) Provisional application No. 60/000,775, filed on Jun. 30, 1995.

(51) Int. Cl.[7] ..... H04B 1/707; H04L 7/00
(52) U.S. Cl. ..... 375/367; 375/142; 375/145; 375/149; 375/150; 370/342
(58) Field of Search ..... 375/140, 141, 375/142, 144, 145, 149, 150, 367; 370/320, 335, 342, 441

(56) References Cited

U.S. PATENT DOCUMENTS

| | | | | |
|---|---|---|---|---|
| 4,901,307 | A | 2/1990 | Gilhousen et al. | 370/320 |
| 5,022,049 | A | 6/1991 | Abrahamson et al. | 370/320 |

(List continued on next page.)

FOREIGN PATENT DOCUMENTS

| | | | |
|---|---|---|---|
| EP | 0631397 | 12/1994 | |
| GB | 2280575 | 1/1995 | |
| WO | 9428640 | 12/1994 | |
| WO | 9507578 | 3/1995 | 375/200 |

OTHER PUBLICATIONS

Braun et al., "An All–Digital Receiver for Satellite Audio Broadcasting Signals Using Trellis Coded Quasi–Orthogonal Code–Division Muliplexing," European Transactions on Telecommunications and Related Technologies, No. 1, pp. 23–32, Jan./Feb. 1993.

Giannetti et al., "Design of an All–Digital Receiver for Narrowband Continuous–Phase Asynchronous CDMA Systems," IEEE, vol. 3, pp. 468–472, May 1993.

Pahlavan et al., "Performance of Adaptive Matched Filter Receivers Over Fading Multipath Channels," IEEE Transactions on Communications, No. 12, pp. 2106–2113, Dec. 1993.

(List continued on next page.)

*Primary Examiner*—Don N. Vo
(74) *Attorney, Agent, or Firm*—Volpe and Koenig, P.C.

(57) ABSTRACT

Methods for generating code sequences that have rapid acquisition properties and apparatus which implement the methods by processing spreading codes on in-phase and quadrature channels. A first method combines two or more short codes to produce a long code. This method may use many types of code sequences, one or more of which are rapid acquisition sequences of length L that have average acquisition phase searches r=log2L. Two or more separate code sequences are transmitted over the complex channels. If the sequences have different phases, an acquisition may be done by acquisition circuits in parallel over the different code sequences when the relative phase shift between the two or more code channels is known. When the received length L codes or the length L correlation codes used to find the phase of the received codes have a mutual phase delay of L/2, the average number of tests to find the code phase of the received code is L/4. The codes sent on each channel may be the same code, with the code phase in one channel being delayed with respect to the other channel, or they may be different code sequences.

22 Claims, 2 Drawing Sheets

U.S. PATENT DOCUMENTS

| | | | | | |
|---|---|---|---|---|---|
| 5,103,459 | A | | 4/1992 | Gilhousen et al. | 370/320 |
| 5,109,390 | A | | 4/1992 | Gilhousen et al. | 375/200 |
| 5,166,951 | A | | 11/1992 | Schilling | 375/200 |
| 5,166,952 | A | | 11/1992 | Omurg et al. | |
| 5,193,094 | A | | 3/1993 | Viterbi | 375/200 |
| 5,228,054 | A | | 7/1993 | Rueth et al. | 375/200 |
| 5,228,056 | A | | 7/1993 | Schilling | 375/200 |
| 5,245,629 | A | | 9/1993 | Hall | |
| 5,253,268 | A | * | 10/1993 | Omura et al. | 375/150 |
| 5,299,226 | A | | 3/1994 | Schilling | |
| 5,299,228 | A | | 3/1994 | Hall | |
| 5,309,474 | A | | 5/1994 | Gilhousen et al. | 375/200 |
| 5,327,455 | A | | 7/1994 | DeGaudenzi et al. | 375/200 |
| 5,353,352 | A | | 10/1994 | Dent et al. | 375/200 |
| 5,361,276 | A | | 11/1994 | Subramanian | |
| 5,377,183 | A | | 12/1994 | Dent | 375/200 |
| 5,392,287 | A | | 2/1995 | Tiedemann, Jr. et al. | |
| 5,414,728 | A | | 5/1995 | Zehavi | 375/200 |
| 5,416,797 | A | | 5/1995 | Gilhousen et al. | 375/200 |
| 5,420,896 | A | | 5/1995 | Schilling | 375/200 |
| 5,442,662 | A | | 8/1995 | Fukasawa et al. | 375/200 |
| 5,654,980 | A | * | 8/1997 | Latva-aho et al. | 375/148 |
| 5,872,810 | A | * | 2/1999 | Philips et al. | 375/222 |

OTHER PUBLICATIONS

Rick et al. "Noncoherent Parallel Acquisition in CDMA Spread Spectrum Systems," IEEE, pp. 1422–1426, May 1994.

Valerio Bernasconi, "Receiver Architectures for the Down–link in a DS–CDMA Mobile System," IEEE Transactions on Communications, pp. 51–55, Sep. 1994.

Zhao Liu et al., "Sir–Based Call Admission Control For DS–CDMA Cellular Systems" IEEE Journal on Selected Areas in Communications, May 1994, 639640.

* cited by examiner

SPREADING CODE SEQUENCE ACQUISITION SYSTEM AND METHOD THAT ALLOWS FAST ACQUISITION IN CODE DIVISION MULTIPLE ACCESS (CDMA) SYSTEMS

Matter enclosed in heavy brackets [ ] appears in the original patent but forms no part of this reissue specification; matter printed in italics indicates the additions made by reissue.

This application claims the benefit of U.S. Provisional Application 60/000,775 filed Jun. 30, 1995.

BACKGROUND OF THE INVENTION

The present invention generally pertains to Code Division Multiple Access (CDMA) communications, also known as spread-spectrum communications. More particularly, the present invention pertains to a new system and method employing a new code sequence design for providing fast acquisition of a received spreading code phase in a CDMA communications system.

DESCRIPTION OF THE RELEVANT ART

Recent advances in wireless communications have used spread spectrum modulation techniques to provide simultaneous communication by multiple users. Spread spectrum modulation refers to modulating a information signal with a spreading code signal; the spreading code signal being generated by a code generator where the period Tc of the spreading code is substantially less than the period of the information data bit or symbol signal. The code may modulate the carrier frequency upon which the information has been sent, called frequency-hopped spreading, or may directly modulate the signal by multiplying the spreading code with the information data signal, called direct-sequence (DS) spreading. Spread-spectrum modulation produces a signal with bandwidth substantially greater than that required to transmit the information signal. The original information is recovered at the receiver by synchronously demodulating and despreading the signal. The synchronous demodulator uses a reference signal to synchronize the despreading circuits to the input spread-spectrum modulated signal in order to recover the carrier and information signals. The reference signal may be a spreading code which is not modulated by an information signal. Such use of a synchronous spread-spectrum modulation and demodulation for wireless communication is described in U.S. Pat. No. 5,228,056 entitled SYNCHRONOUS SPREAD-SPECTRUM COMMUNICATIONS SYSTEM AND METHOD by Donald L. Schilling, which techniques are incorporated herein by reference.

One area in which spread-spectrum techniques are used is in the field of mobile cellular communications to provide personal communication services (PCS). Such systems desirably support large numbers of users, control Doppler shift and fade, and provide high speed digital data signals with low bit error rates. These systems employ a family of orthogonal or quasi-orthogonal spreading codes, with a pilot spreading code sequence synchronized to the family of codes. Each user is assigned one of the spreading codes as a spreading function. Related problems of such a system include: handling multipath fading effects. Solutions to such problems include diversity combining of multipath signals. Such problems associated with spread spectrum communications, and methods to increase capacity of a multiple access, spread-spectrum system are described in U.S. Pat. No. 4.901,307 entitled SPREAD SPECTRUM MULTIPLE ACCESS COMMUNICATION SYSTEM USING SATELLITE OR TERRESTRIAL REPEATERS by Gilhousen et al. which is incorporated herein by reference.

The problems associated with the prior art systems focus around reliable reception and synchronization of the receiver despreading circuits to the received signal. The presence of multipath fading introduces a particular problem with spread spectrum receivers in that a receiver must somehow track the multipath components to maintain code-phase lock of the receiver's despreading means with the input signal. Prior art receivers generally track only one or two of the multipath signals, but this method may not be satisfactory because the combined group of low power multipath signal components may actually contain far more power than the one or two strongest multipath components. The prior art receivers track and combine the strongest components to maintain a predetermined Bit Error Rate (BER) of the receiver. Such a receiver is described, for example, in U.S. Pat. No. 5,109,390 entitled DIVERSITY RECEIVER IN A CDMA CELLULAR TELEPHONE SYSTEM by Gilhousen et al. A receiver that combines all multipath components, however, is able to maintain the desired BER with a signal power that is lower than that of prior art systems because more signal power is available to the receiver. Consequently, there is a need for a spread spectrum communication system employing a receiver that tracks substantially all of the multipath signal components, so that substantially all multipath signals may be combined in the receiver, and hence reduce the required transmit power of the signal for a given BER.

Providing quality telecommunication services to user groups which are classified as remote. Such as rural telephone systems and telephone systems in underdeveloped countries, has proved to be a challenge in recent years. These needs have been partially satisfied by wireless radio services, such as fixed or mobile frequency division multiplex (FDM), frequency division multiple access (FDMA), time division multiplex (TDM), time division multiple access (TDMA) systems, combination frequency and time division systems (FD/TDMA), and other land mobile radio systems. Usually, these remote services are faced with more potential users than can be supported simultaneously by their frequency or spectral bandwidth capacity.

The problems associated with the prior art systems focus around reliable reception and synchronization of the receiver despreading circuits to the received signal. Since spreading code sequences in a communications system which supports a relatively large number of users may be very long with a corresponding long code period, one particular problem associated with prior spread spectrum receivers is to rapidly determine the correct code phase of a received spread spectrum signal. One solution of fast acquisition of the correct spreading code phase is to form spreading code sequences with specific characteristics which a receiver can derive from a particular received code phase.

For example, prior art systems employ a method in which a code generator produces a pseudorandom code of length N, divides the code in half to generate two new codes with code period N/2, and multiplies the data with each code for transmission over an In-phase and Quadrature channel. The receiver only searches for the occurrence of the short code period on the I or Q channel. The advantage of the system is that the number of users supportable with codes of length N can be transmitted with a bandwidth necessary to support codes of length N/2. Such a system is described in U.S. Pat. No. 5,442,662 entitled CODE-DIVISION MULTIPLE-ACCESS COMMUNICATIONS SYSTEM PROVIDING ENHANCED CAPACITY WITHIN LIMITED BANDWIDTH to Fakasawa et al. with is incorporated herein by reference.

Another method and apparatus for producing a composite code for fast acquisition in a CDMA system may employ a code that is made to appear more complex by the use of one or more masking codes. The composite code generator comprises a plurality of component code generators. The composite codes are used to modulate in-phase and quadrature channels. A receiver has enhanced speed of acquisition because of the shorter time needed to search for composite codes in the quadrature channel, and the plurality of component codes of the in-phase channel are derived from the codes used in the quadrature channel. Such a system is described in U.S. Pat. No. 5,022,049 entitled MULTIPLE ACCESS CODE ACQUISITION SYSTEM to Abrahamson et al. which is incorporated herein by reference.

In related CDMA systems, a two-tier ciphering method ensures security by cycling code masks. A pseudorandomly generated code key is used to select one of a plurality of scramblingmasks. A variant of this method uses orthogonal code hopping or random code hopping. A CDMA system can be viewed as encoding an information signal into blocks of L code symbols, and each block is then encoded with a scrambling mask of length L. A system of this type is described in U.S. Pat. No. 5,353,352, entitled CALLING CHANNEL IN CDMA COMMUNICATIONS SYSTEM to Dent et al. which is incorporated herein by reference.

SUMMARY OF THE INVENTION

Rapid acquisition of the correct code phase by a spread-spectrum receiver is improved by designing spreading codes which are faster to detect. The present embodiment of the invention includes a new method of generating code sequences that have rapid acquisition properties by using one or more of the following methods. First, a long code may be constructed from two or more short codes. The new implementation uses many code sequences, one or more of which are rapid acquisition sequences of length L that have average acquisition phase searches r=log2L. Sequences with such properties are well known to those practiced in the art. The average number of acquisition test phases of the resulting long sequence is a multiple of r=log2L rather than half of the number of phases of the long sequence.

Second, a method of transmitting complex valued spreading code sequences (In-phase (I) and Quadrature (Q) sequences) in a pilot spreading code signal may be used rather than transmitting real valued sequences. Two or more separate code sequences may be transmitted over the complex channels. If the sequences have different phases, an acquisition may be done by acquisition circuits in parallel over the different code sequences when the relative phase shift between the two or more code channels is known. For example, one of two sequences may he sent on an In phase (I) channel while the other is sent on the Quadrature (Q) channel. To search the code sequences, the acquisition detection means searches the two channels, but begins the (Q) channel with an offset equal to one-half of the length of the spreading code sequence. With a code sequence length of N, the acquisition means starts the search at N/2 on the (Q) channel. The average number of tests to find acquisition is N/2 for a single code search, but searching the (I) and phase delayed (Q) channel in parallel reduces the average number of tests to N/4. The codes sent on each channel may be the same code, with the code phase in one channel being delayed with respect to the other channel, or they may be different code sequences.

DETAILED DESCRIPTION OF THE INVENTION

In a CDMA communication system where they are a number of users, each user's signal is coded using a unique code sequence. Consequently, a receiver can detect the signal coming from a particular user. The first step in establishing a communication link with a user is to acquire the received spreading code phase. Typically, this process includes determining the phase (shift) of the observed sequence.

Communication is not possible until the proper spreading code phase has been determined. The invention described here in a new method of designing the code sequences such that a receiver can rapidly determine the received code sequence phase.

Generally, in a spread spectrum communication system, the receiver does not initially know the received spreading code phase. A particular system may "guess" at a spreading code phase and attempt to despread the received signal. If the despread signal is despread, the receiver declares synchronization, but if the signal is not despread, the receiver adjusts the locally generated code phase to a new value ("guess") and repeats the test. An exemplary acquisition system is shown in FIG. 1.

Figure 1:
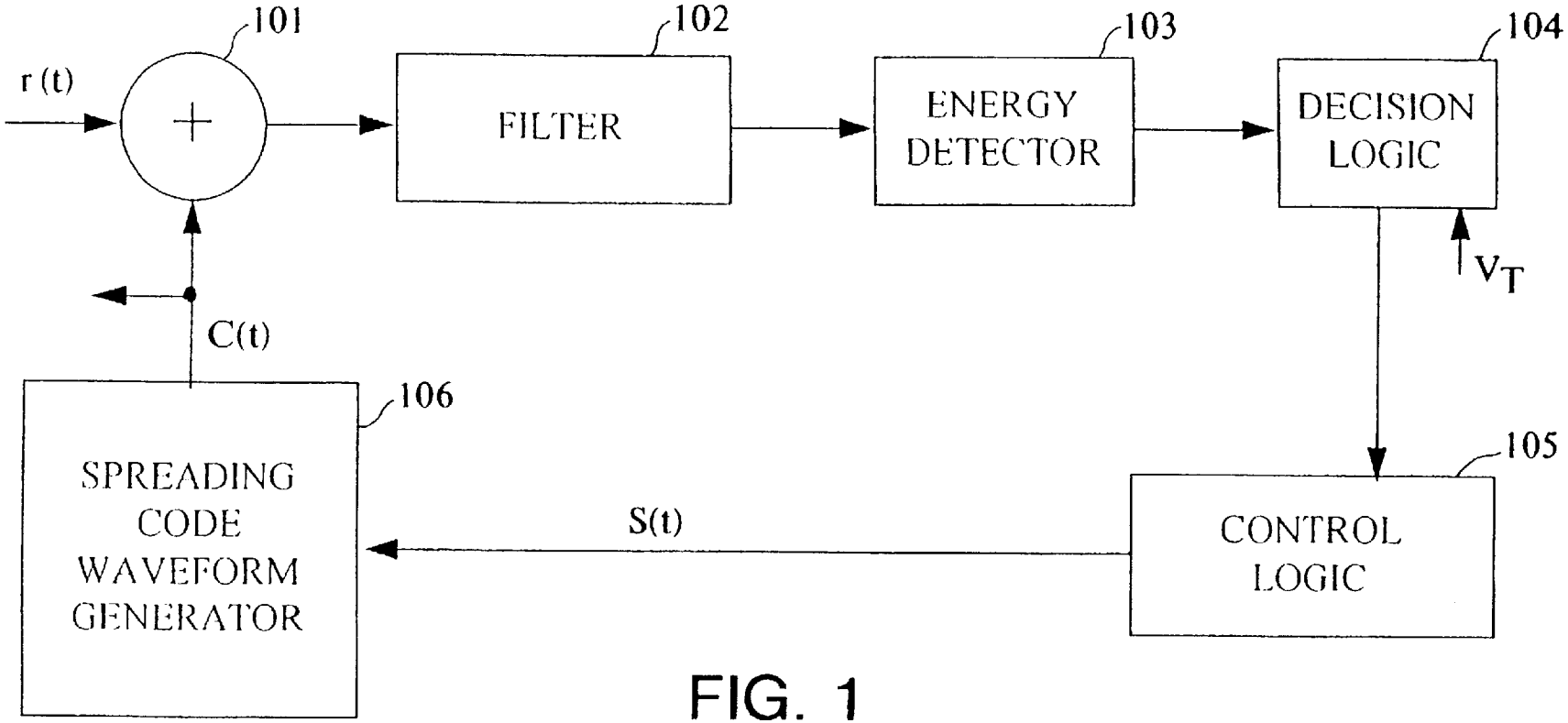
FIG. 1 PRIOR ART
FIG. 1 is a block diagram of a typical code division multiple access communication system spreading code acquisition detector of the prior art.

Referring to FIG. 1, the received signal r(t) is applied to a multiplier 101 and multiplied by the locally generated code sequence signal c(t) to attempt to despread the received signal r(t). The signal produced after the despreading either corresponds the received signal power plus noise power is the locally generated code phase is synchorinzed to the received spreading code phase, or corresponds to noise power only if the locally generated code phase is not synchronized to the received spreading code phase. Since the despread signal is a narrowband signal compared to the bandwidth of the spreading code, the output signal of the despreader is applied to the filter 102, which can be a bandpass or matched filter. The output despread signal is applied to the energy detector 103, which is used to measure the despread signal power.

The decision logic 104 compares the despread signal power to a predetermined threshold value $V_\tau$ to decide whether the locally generated code phase is synchronized to the received signal. The decision logic provides a decision value to the control logic which determines whether synchronization is achieved. If there is synchronization, the search is stopped, but if synchronization has not been achieved, the control logic (105) adjusts the code phase of the locally generated signal c(t) by sending the appropriate code phase adjustment signal s(t) to the spreading code waveform generator (106).

The appropriate code phase adjustment signal s(t) is determined by search technique implemented in the control logic (105). Existing systems typically employ serial search techniques, which are well known in the art. Using these techniques, each code phase is searched one at a time in sequence. Other search techniques may be used, such as a Z-search method by which each code phase before and after a chosen code phase is searched alternatively, each test increasing the phase shift of the tested code phase from the initial chosen code phase. This technique is commonly used to resynchronize a system which has temporarily lost code phase synchronization.

the method of one embodiment of the present invention uses a transmitted spreading code sequence (a long sequence) which is generated using two short sequences. The long sequence (the new code sequence) is formed by repeating one of the short sequences according to a predetermined method defined by the second short sequence. For example, if the first short sequences is 0110 and the second short sequence is 1100, and if the predetermined method is such that the first sequence is repeated as it is for each 1 in the second sequence and inverted for each 0 in the second sequence, the long sequence is 0110 0110 1001 1001. In another method the first short sequence is repeated as it is when the bit value in the second sequence does not change, and the first sequence is inverted when the bit value in the second sequence changes from 1 to 0 or 0 to 1. In this example, the long sequence would be 0110 0110 1001 0110.

A specific embodiment of the applicant's invention uses maximal length sequences (m-sequences). The m-sequences are generated using shift register circuits as is well known in the art. These sequences have the important property that if a shift register of length r is used, the period of the m-sequence is N=2'−1, and so r-bit portion of the m-sequence repeats in a period (each r bit section occurs only once in a period). The implication of this property is that, when the second short sequence described above is an m-sequence, the acquisition circuit needs to search only $r=\log_2 N$ phases of the sequence instead of N phases, which makes acquisition much faster.

For example, if the first short sequence has a length of 511 code periods or chips, and the second short sequence (m-sequence) has a length of 1023 code periods. Then the long sequence (the final sequence is of length 511×1023=522753. Since $1023=2^{10}-1$, the acquisition circuit will acquire the code in at most 511×10=5110 phases instead of 522753 phases. Therefore the worst-case acquisition is over one hundred times faster.

It may be desirable for the short code phase to have boundaries which are aligned with information symbols that are transmitted through the channel. Because symbols are typically represented by $2^n$ bits, symbol boundaries will occur on even-numbered bit boundaries. As described above, the short code has a length of 511 code periods. In order for the short code to be aligned with symbol boundaries when the symbols each include $2^n$ bits, it may be desirable to concatenate another bit, either 1 or 0 onto the [551] *511* length first short sequence to form a 512 short code. In this instance, the length of the long sequence would be 512×1023=523776 code periods. Alternatively, the second short sequence may be extended to be an even number of code periods. For example, if the second short sequence were extended to 1024 bits, the length of the long sequence would be 511×1024=523264 code periods.

To further decrease the acquisition time, one embodiment of the invention transmits complex valued spreading code sequences (In-phase (I) and Quadrature (Q) sequences) in a pilot spreading code signal, rather than transmitting real valued sequences. Two or more separate code sequences may be transmitted over the complex channels. If there is a known phase shift between the codes, an acquisition may be done in parallel over the different code sequences.

In this embodiment, one sequence is used to modulate the [In phase] *In-phase* (I) carrier while the other phase modulates the Quadrature (Q) carrier. To search the code sequences, the acquisition detection means searches the two channels simultaneously. If there is no phase shift between the two code phases, the acquisition means begins the search on the (I) channel at the beginning of the code sequence, but begins the (Q) channel with an offset equal to one-half of the spreading code sequence length. For this example, the acquisition means may search either channel beginning at any particular phase, as long as the search of the other channel begins by offsetting the search by a predetermined code sub-period. For example, with a code sequence length of N, the acquisition means start the search at N/2 on the (Q) channel. The average number of tests to find acquisition is N/2 for a single code search, but searching the (I) and phase delayed (Q) channel in parallel with an initial offset of N/2 code periods, reduces the average number of tests to N/4. The codes sent on each channel may be the same code, the same code sequence but delayed in one channel, or different code sequences.

Figure 2:
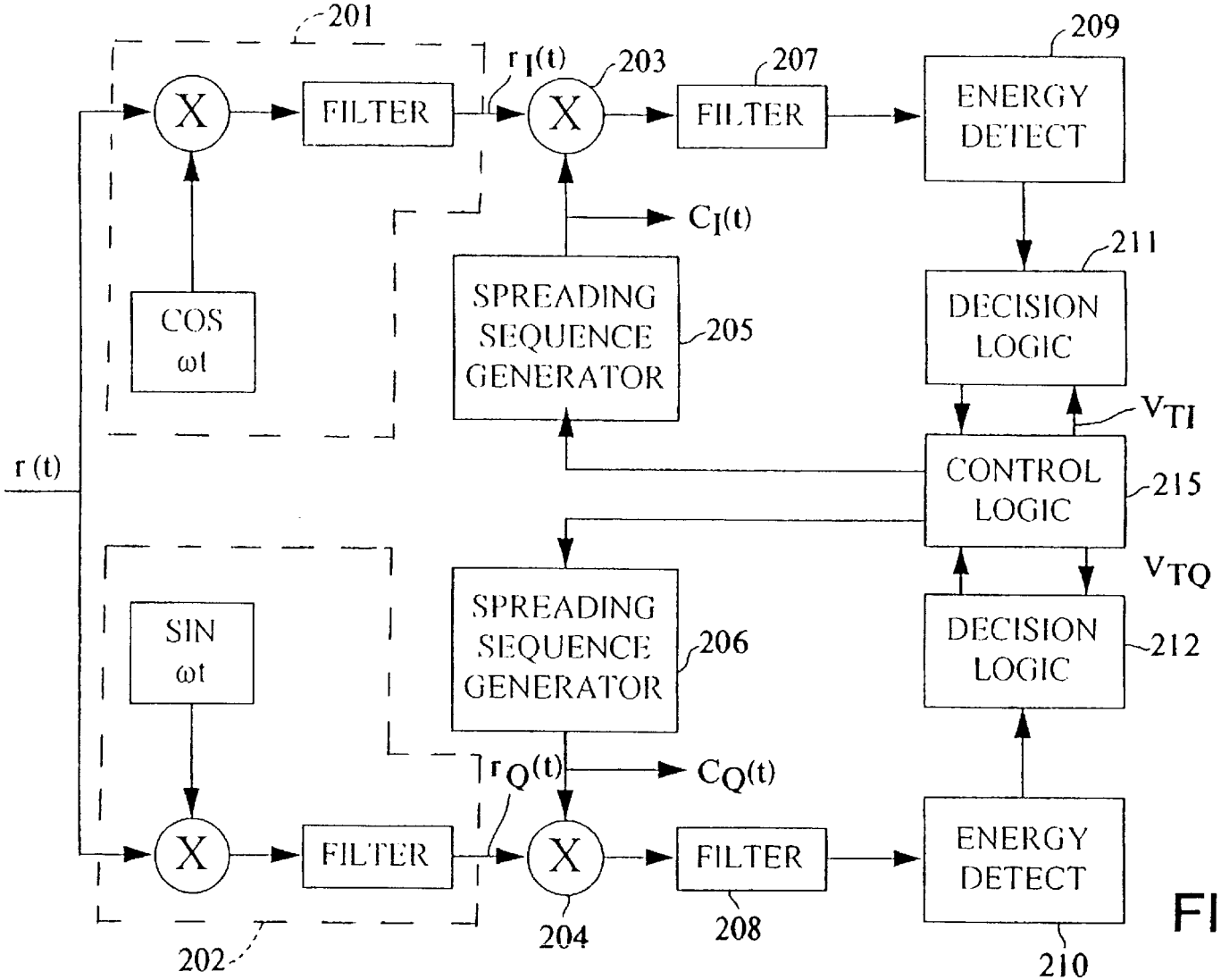
FIG. 2 is a block diagram of the spreading code acquisition detector of the present invention.

An exemplary embodiment of a receiver which uses the fast acquisition sequences of the present invention is shown in FIG. 2. The received signal r(t) is demodulated by the synchronous In-phase demodulator 201 and by the synchronous Quadrature modulator 202 to produce [in phase] *in-phase* channel signal $r_r(t)$ and quadrature channel signal $r_Q(t)$.

For the [in phase] *in-phase* channel signal $r_r(t)$, the locally generated code sequence begins searching the received [in phase] *in-phase* channel with the long code spreading code sequence using a predetermined initial code phase. After despreading in multiplier 203, the in-phase signal is applied to a bandpass, envelope or matched filter 207 to produce a despread. Next, the energy detector 209 generates a measure of the signal power in the in-phase channels and applies this measure to decision logic 211. The decision logic 211 compares the despread signal energy with the predetermined threshold $V_\pi$ with three possible outcomes. First, the measured energy level may indicate that the code phase of the locally generated despreading code sequence from the [quadrature] *in-phase* channel spreading code generator 205 corresponds to acquisition of the correct code phase of the long code sequence. In this instance, the control logic 215 provides long code synchronization signals to spreading code generators 205 and 206 to lock the code phase of the generator 205 and to adjust the generator 206 to the offset code phase. Second, the measured energy level may indicate that the locally generated code phase corresponds to acquisition of the short code phase, in which case the control logic 215 provides short code synchronization signals to the spreading code generators 205 and 206, and initiates the next series of tests. These tests adjust the locally generated code sequence signal phases by the length of the short code instead of by the period of one code sequence value until synchronization of the long code is found. Third, the measured energy level may indicate that the locally generated code phase does not correspond to synchronization of either the long or short code, in which case the control logic continues the serial search by adjusting the phases of the locally generated code sequences by one code sequence period for each successive test.

The system operates in the same way for the quadrature channel signal $r_Q(t)$. The locally generated code sequence has a phase which is offset by one-half of a code period of the locally generated code sequence used to despread the in phase channel signal $r_r(t)$. After despreading in multiplier 204, bandpass, envelope or matched filtering in the filter 208, and measuring the despread quadrature signal power in the energy detector 210, the decision logic 212 compares the signal to a predetermined threshold $V_{rQ}$ to determine one of three possibilities. First, whether the code phase of the locally generated despreading code sequence from the quadrature channel spreading code generator 206 corresponds to acquisition of the correct code phase of the long code sequence, in which case the control logic 215 provides the long code synchronization signals to spreading code generators 206 and 205 to lock and adjust their respective code phases. Second, whether the locally generated code phase corresponds to acquisition of the short code phase. As with the in-phase channel, in this instance, the control logic 215 provides short code synchorinzation signals to the spreading code generators 205 and 206, and performs the next series of tests by adjusting the locally generated code sequence signal phases by the length of the short *code* until synchronization of the long code is found. Third, whether the locally generated code phase doe s not correspond to synchronization of either the long or short code in which case the control logic continues the serial search by adjusting the locally generated code sequences phases by one code sequence period for each successive test.

Further, the control logic 215 may adjust the threshold values $V_{\pi}$ and $V_{rQ}$ to greater values when the short code is detected on either the in-phase or quadrature channels to increase the probability of detection and decrease probability of false detection.

While the invention has been described in terms of an exemplary embodiment, it is contemplated that it may be practiced as outlined above with modifications that are within the scope of the following claims.

The invention claimed is:

1. A fast acquisition apparatus for quickly synchronizing a spreading code phase of a spread-spectrum communication system to a transmitted code signal having a transmitted in-phase (I) code signal and a transmitted quadrature (Q) code signal, said transmitted I-code signal including a first spreading code sequence and said transmitted Q-code signal including a second spreading code sequence; the transmitted I-code signal and the transmitted Q-code signal having a predetermined mutual code sequence phase offset value, the fast acquisition apparatus comprising:

receiving means for receiving the transmitted code signal and for separating, from the received code signal, the transmitted I-code signal and the transmitted Q-code signal;

correlating means for correlating code sequences with the transmitted code signal and comprising an I-code signal correlator and a Q-code signal correlator;

a local code sequence generator responsive to a code control signal value to generate a local portion of the I-code sequence having an I-code phase value and a local portion of the Q-code sequence having a Q-code phase value; and controller means for determining, obtaining and maintaining code sequence lock said controller means coupled to the I-code signal correlator, the Q-code signal correlator, and the local code sequence generator, said I-code signal correlator correlating said local portion of the I-code sequence with said transmitted I-code signal and generating an I-high value provided to said controller means when the I-code phase value of the local portion of the I-code sequence and a code phase value of the transmitted I-code signal have matching code phase values and said Q-code signal correlator correlating said local portion of the Q-code sequence with said transmitted Q-code signal and generating a Q-high value provided to said controller means when the Q-code phase value of the local portion of the Q-code sequence and a code phase value of the transmitted Q-code signal have matching code phase values;

wherein said controller means using said predetermined mutual code sequence phase offset value, generates the code control signal value to lock the I-code phase value of the local portion of the I-code sequence responsive to the I-high value and to set the Q-code phase value of the local portion of the Q-code sequence, and generates the code control signal value to lock the Q-code phase value of the local portion of the Q-code sequence responsive to the Q-high value and to set the I-code phase value of the local portion of the I-code sequence; and said controller means is responsive to the absence of the I-high value and the Q-high value to generate the code control signal value which adjusts the I-code phase value and the Q-code phase value.

2. The fast acquisition apparatus of claim 1, wherein the first spreading code sequence is equivalent to the second spreading code sequence, and the transmitted I-code signal and the transmitted Q code signal have the predetermined mutual code sequence phase relationship such that the respective code phases are not identical.

3. The fast acquisition apparatus of claim 1, wherein the first spreading code sequence and the second spreading code sequence are each chosen from a plurality of fast acquisition sequences of length L code periods; each of said fast acquisition sequences including a short code portion having length of N code periods and a long code portion having length of M code periods and having a mean search value of log 2L phases wherein said short code portion occurs repetitively, where L, M and N are integers, wherein:

said local portion of the I-code sequence includes an I-sequence equivalent to the short code portion of the respective fast acquisition sequence, and said local portion of the Q-code sequence includes a Q-sequence equivalent to the short code portion of the respective fast acquisition sequence;

said I-code signal correlator further includes means for generating an I-middle value when the I-code phase value of the local portion of the I-code sequence and the code phase of the transmitted I-code signal have code phase values which correspond to the I-sequence being in phase with one occurrence of the respective short code sequence of the first spreading code sequence;

said Q-code signal correlator further includes means for generating a Q-middle value when the Q-code phase of the local portion of the Q-code sequence and the code phase of the transmitted Q-code signal have code phase values which correspond to the Q-sequence being in phase with one occurrence of the respective short code sequence of the second spreading code sequence; and said controller is responsive to the I-middle value and to the absence of the I-high value and the Q-high value for generating the code control signal having a value which adjusts the I-code phase value and the Q-code phase value to maintain the respective local short code sequence portion of the local portion of the I-code sequence in phase with each respective occurrence of the short code sequence of the first spreading code sequence; and being responsive to the Q-middle value and the absence of the I-high value and the Q-high value for generating the code control signal value for adjusting the I-code phase value and the Q-code phase value to maintain the respective Q-sequence of the local portion of the Q-code sequence in phase with each respective occurrence of the short code sequence of the second spreading code sequence.

4. The fast acquisition apparatus of claim 3, wherein N is an even integer and M is an odd integer.

5. The fast acquisition apparatus of claim 3, wherein N is an odd integer and M is an even integer.

6. The fast acquisition apparatus of claim 3, wherein L is equal to M multiplied by N.

7. The fast acquisition apparatus of claim 3, wherein L is equal to the least common multiple of M and N.

8. The fast acquisition apparatus of claim 3, wherein the first spreading code sequence and the second spreading code sequence are shifted in phase by L/2 code sequences relative to each other.

*9. A fast code acquisition detector for a code division multiple access receiver wherein the code sequence of the signal to be received has I-code and Q-code signal components which have a known phase relationship comprising:*

*an I-code despreader for despreading an I-code signal component with a despreading sequence at a selected phase value and outputting the result;*

*a Q-code despreader for despreading a Q-code signal component with a despreading sequence at a selected phase value and outputting the result; and*

*a controller for controlling the selected phase values of said I-code and Q-code despreaders in response to a phase acquisition correlation of each of the outputs of said I-code and Q-code despreaders such that:*

*said I-code despreader is provided an initial I-code phase value and said Q-code despreader is provided with an initial Q-code phase value which is off-set a predetermined amount from said I-code initial phase value;*

*if the correlation of the output of neither said I-code or Q-code despreaders indicates signal phase acquisition, said controller selectively increments the selected phase value of said I-code and Q-code despreaders; and*

*if the correlation of the output of one of said I-code and Q-code despreaders indicates phase acquisition, said controller selectively increments the selected phase value of the other despreader based on the known phase relationship so that both despreaders output a phase correct despread signal.*

*10. A fast code acquisition detector according to claim 9 further comprising:*

*a first demodulator having a received signal input and a filtered I-code signal output coupled to said I-code despreader; and*

*a second demodulator having a received signal input and a filtered Q-code signal output coupled to said Q-code despreader.*

*11. A fast code acquisition detector according to claim 9 wherein:*

*said I-code despreader includes a phase adjustable spreading sequence generator which generates an I-despreading sequence at said selected phase value as controlled by said controller; and*

*said Q-code despreader includes a phase adjustable spreading sequence generator which generates a Q-despreading sequence at said selected phase value as controlled by said controller.*

*12. A fast code acquisition detector according to claim 9 wherein:*

*each of the I-code and Q-code signal components has a code sequence period of length L consisting of a plurality of subsequences having a period of length N, where L and N are integers such that L>N; and*

*said controller controls the selected phase values of said I-code and Q-code despreaders in response to a correlation of each of the outputs of said I-code and Q-code despreaders such that said controller increments the selected phase value of said I-code and Q-code despreaders by N is the correlation of either said I-code or Q-code despreaders indicates phase acquisition of the signal N-period subsequences and the correlation of the output of neither said I-code or Q-code despreaders indicates signal phase acquisition.*

*13. A fast code acquisition detector according to claim 12 further comprising:*

*a first correlator associated with said controller having an I-code despreader energy output detector which utilizes a first threshold for detection of despread N-period subsequences or a higher second threshold; and*

*a second correlator associated with said controller having a Q-code despreader energy output detector which utilizes a first threshold for detection of despread N-period subsequences or a higher second threshold; and*

*said correlators using said second higher threshold after either correlator detects acquisition of despread N-period subsequences.*

*14. A fast code acquisition detector according to claim 9 wherein each of the I-code and Q-code signal components has a code sequence period of length L and wherein the phase relationship between the I-code and Q-code signal components is a phase shift of L/2 whereby said controller selects a correct phase value for said despreaders within L/4 iterations of phase acquisition correlations.*

*15. A fast code acquisition detector for a code division multiple access receiver, wherein the code sequence of the signal to be received has a period of length L consisting of a plurality of subsequences having a period of length N, where L and N are integers such that L>N, comprising:*

*a despreader for despreading a signal with a despreading sequence at a selected phase value and outputting the result; and*

*a controller for controlling the selected phase value of said despreader in response to a phase acquisition correlation of the output of said despreader such that: said despreader is provided an initial phase value;*

*if the correlation of the output of said despreader does not indicate signal phase acquisition or phase acquisition of the signal N-period subsequences, said controller increments the selected phase value of said despreader by one; and*

*if the correlation of the output of said despreader indicates phase acquisition of the signal N-period subsequences, but not signal phase acquisition, said controller increments the selected phase value of said despreading by N.*

*16. A fast code acquisition detector according to claim 15 further comprising:*

*a correlator associated with said controller having a despreader energy output detector which utilizes a first threshold for detection of despread N-period subsequences or a higher second threshold; and*

*said correlator using said second higher threshold after said correlator detects acquisition of despread N-period subsequences.*

*17. A fast code acquisition detection method for a code division multiple access receiver wherein the code sequence of the signal to be received has I-code and an Q-code signal components which have a known phase relationship comprising:*

*despreading an I-code signal component with a despreading sequence at a selected phase value to produce a despread I signal;*

*despreading a Q-code signal component with a despreading sequence at a selected phase value to produce a despread Q signal;*

*controlling the selected phase values of said I-code and Q-code despreading in response to a phase acquisition correlation of the despread I and Q signals;*

*said I-code despreading being performed at an initial I-code phase value and said Q-code despreading being performed at an initial Q-code phase value which is off-set a predetermined amount from said I-code initial phase value;*

*if the correlation of neither the despread I or Q signals indicates signal phase acquisition, selectively incrementing the selected phase value of said I-code and Q-code despreading; and*

*if the correlation of one of the despread I or Q signals indicates phase acquisition, selectively incrementing the selected phase value of the other despreading based on the known phase relationship so that both said I-code and Q-code despreading produce phase correct despread signals.*

*18. A fast code acquisition detection method according to claim 17 further comprising:*

*demodulating and filtering a received signal input to produce a filtered I-code signal component for said I-code despreading; and*

*demodulating and filtering a received signal input to produce a filtered Q-code signal component for said Q-code despreading.*

*19. A fast code acquisition detection method according to claim 17 wherein each of the I-code and Q-code signal components has a code sequence period of length L consisting of a plurality of subsequences having a period of length N, where L and N are integers such that L>N, and wherein the controlling of the selected phase values of said I-code and Q-code despreading in response to a correlation of said I and Q signals is such that the incrementing of the selected phase value of said I-code and Q-code despreading is by N when the correlation of either said I or Q signal indicates phase acquisition of the signal N-period subsequences and the correlation of the output of neither said I or Q signal indicates signal phase acquisition.*

*20. A fast code acquisition detection method according to claim 19 further comprising:*

*correlating said I signal based on energy detection at a first threshold for detecting despread N-period subsequences or at a higher second threshold;*

*correlating said Q signal based on energy detection at a first threshold for detecting of despread N-period subsequences or at a higher second threshold; and*

*said correlating being at said second higher threshold after either I signal or Q signal correlating detects acquisition of despread N-period subsequences.*

*21. A fast code acquisition detection method for a code division multiple access receiver, wherein the code sequence of the signal to be received has a period of length L consisting of a plurality of subsequences having a period of length N, where L and N are integers such that L>N, comprising:*

*despreading a signal with a despreading sequence at a selected phase value to produce a despread signal; and*

*controlling the selected phase value of said despreading in response to a correlation of the despread signal against a predetermined threshold;*

*initially despreading at an initial phase value; and*

*if the correlation of the despread signal does not indicate signal phase acquisition or phase acquisition of the signal N-period subsequences, incrementing the selected phase vale of said despreading by one; and*

*if the correlation of the despread signal indicates phase acquisition of the signal N-period subsequences and the correlation does not indicate signal phase acquisition, incrementing the selected phase value of said despreading by N.*

*22. A fast code acquisition detection method according to claim 21 further comprising:*

*correlating said despreading based on energy detection at a first threshold for detection of despread N-period subsequences or at a higher second threshold; and*

*said correlating being at said second higher threshold after the correlating detects acquisition of despread N-period subsequences.*

* * * * *